United States Patent [19]

Chao-Fan Chu et al.

[11] Patent Number: 5,170,319

[45] Date of Patent: Dec. 8, 1992

[54] ENHANCED MULTICHIP MODULE COOLING WITH THERMALLY OPTIMIZED PISTONS AND CLOSELY COUPLED CONVECTIVE COOLING CHANNELS

[75] Inventors: Richard Chao-Fan Chu; Michael J. Ellsworth, Jr., both of Poughkeepsie; Gary F. Goth, Pleasant Valley; Robert E. Simons; Michael L. Zumbrunnen, both of Poughkeepsie, all of N.Y.

[73] Assignee: International Business Machines Corporation, Armonk, N.Y.

[21] Appl. No.: 780,688

[22] Filed: Oct. 18, 1991

Related U.S. Application Data

[63] Continuation of Ser. No. 532,722, Jun. 4, 1990.

[51] Int. Cl.$^5$ .............................................. H05K 7/20
[52] U.S. Cl. ................................. 361/382; 165/80.3; 165/170; 361/385; 257/714
[58] Field of Search ............... 165/80.3, 80.4, 104.33, 165/185, 109.1, 170; 174/16.3; 357/81, 82; 361/382, 383, 385–389

[56] References Cited

U.S. PATENT DOCUMENTS

| | | | |
|---|---|---|---|
| 3,524,497 | 8/1970 | Chu et al. | 165/80 |
| 4,193,445 | 3/1980 | Chu | 361/387 |
| 4,226,281 | 10/1980 | Chu | 361/386 |
| 4,639,829 | 1/1987 | Ostergren | 361/385 |
| 4,686,606 | 8/1987 | Yamada et al. | 361/385 |
| 4,748,495 | 5/1988 | Kucharek | 357/82 |
| 4,758,926 | 7/1988 | Herrell et al. | 361/385 |
| 4,765,400 | 8/1988 | Chu et al. | 165/185 |
| 4,874,035 | 10/1989 | Kashiwada | 165/170 |
| 5,005,638 | 4/1991 | Goth | 165/80.4 |
| 5,016,090 | 5/1991 | Gaylon | 357/82 |
| 5,052,889 | 10/1991 | Abdel-Messeh | 165/70 |
| 5,079,619 | 1/1992 | Davidson | 361/385 |

FOREIGN PATENT DOCUMENTS 341554 3/1984 Fed. Rep. of Germany.

OTHER PUBLICATIONS

"Integrated—Exchanger", IBM Tech Discl Bull vol. 20 No. 11A, Apr. 1978, Antonetti, pp. 4498.
"Cold Plate—Turbulence", IBM Tech Discl Bull vol. 29 No. 2 Jul. 1986, pp. 1086, 1087.
"Extended—Plate", IBM Tech Discl Bull vol. 21 No. 11 Apr. 1979, Dessaner et al, pp. 4481.
"Self-Aligning—Chips", IBM Tech Discl Bull vol. 23 No. 4 Sep. 1980, pp. 1400.
"Enhanced-Module", IBM Tech Discl Bull vol. 30 No. 5 Oct. 1987, pp. 1987.
IBM TDB entitled "Integrated Module Heat Exchanger" by V. Antonetti et al, vol. 20, No. 11A, Apr. 1978, p. 4498.
IBM TDB entitled "Cold Plate... Turbulence", vol. 29 No. 2, Jul. 1986, pp. 689–690.

Primary Examiner—Gerald P. Tolin
Attorney, Agent, or Firm—Richard M. Ludwin; Floyd A. Gonzalez

[57] ABSTRACT

A thermally optimized piston for use in a liquid cooled module. The thermally optimized piston has three distinctive sections, an upper tapered section, a central cylindrical section, and a lower diverging section. In a preferred embodiment, the thermally optimized piston is provided as part of an improved electronic module. The improved electronic module includes enhanced convective cooling channels disposed between the pistons.

14 Claims, 16 Drawing Sheets

FIG. 2A
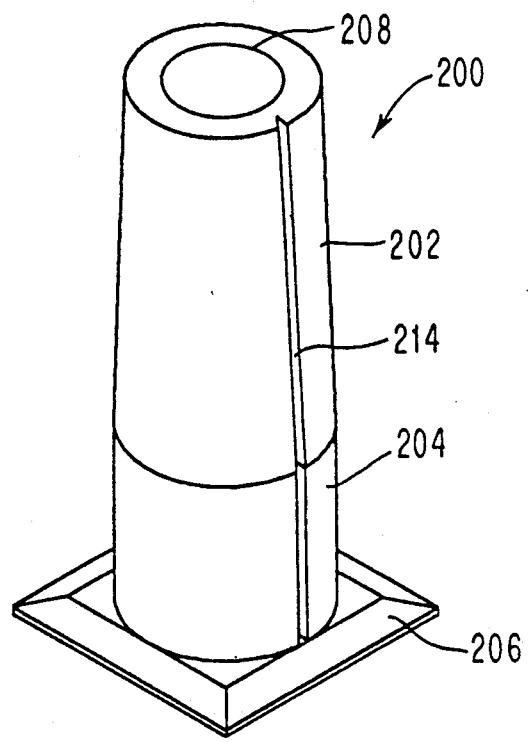
FIG. 2B
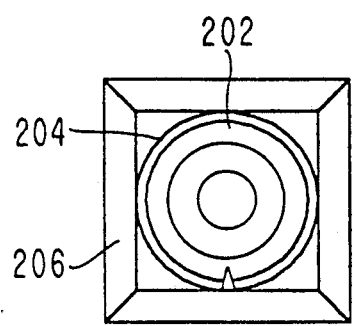
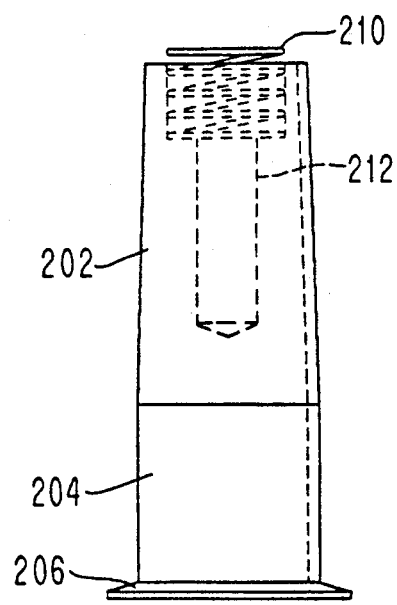
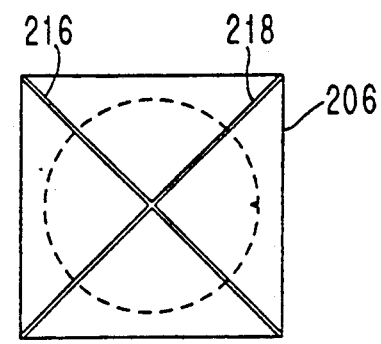
FIG. 2C
FIG. 2D

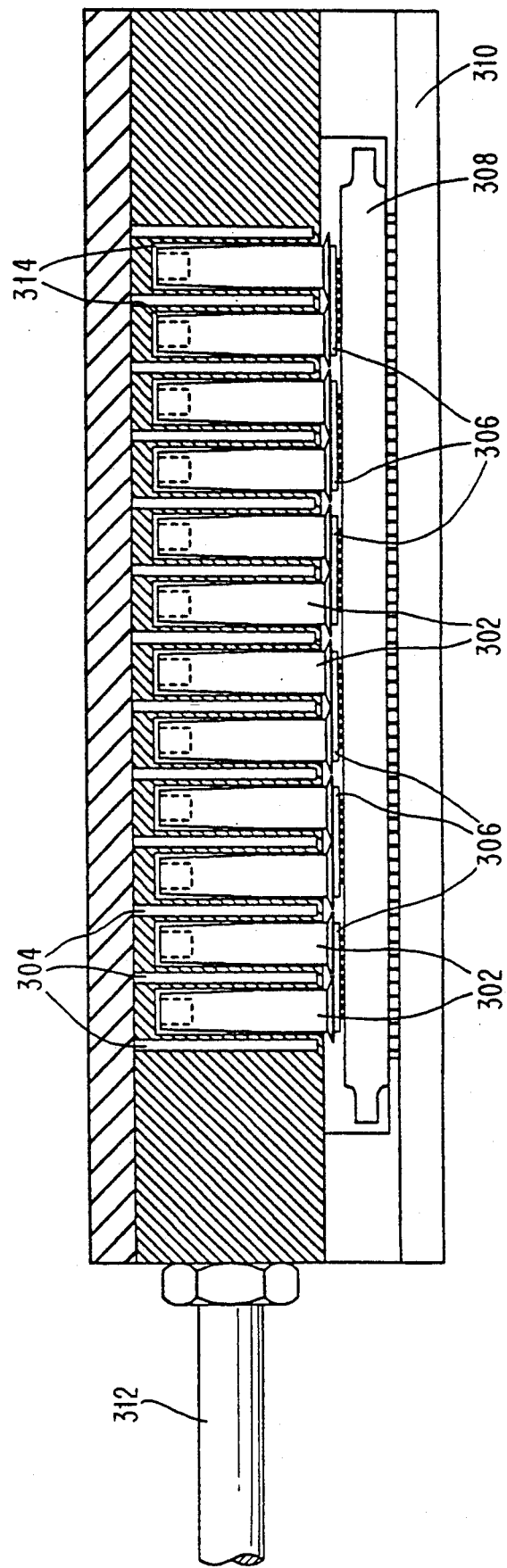

1302

1404  1408  1406

1402

1402

# ENHANCED MULTICHIP MODULE COOLING WITH THERMALLY OPTIMIZED PISTONS AND CLOSELY COUPLED CONVECTIVE COOLING CHANNELS

This is a divisional of copending application(s) Ser. No. 07/532,722 filed on Jun. 4, 1990.

BACKGROUND OF THE INVENTION

1. Field of the Invention

This invention relates to heat transfer mechanisms and more particularly heat transfer mechanisms for removing the heat generated in an electronic circuit module assembly.

2. Related Art

The efficient extraction of heat from electronic circuit modules for very large scale integrated circuit (VLSI) packages has presented a significant limitation on the design and use of such electronic modules. The power consumed in the integrated circuits generates heat which must in turn be removed from the VLSI package. Lacking an efficient heat transfer mechanism, the speed, reliability and power capabilities of the electronic circuit modules are severely limited. As the density of circuits within VLSI chips has increased, the need for improved heat extraction has become even more acute since the more densely packed chips tend to have a higher need for heat dissipation per unit area.

One conventional means of heat extraction has been through the use of a gas encapsulated thermal conduction module of the type described in U.S. Pat. No. 4,226,281. In FIG. 1, there is shown a cross sectional view of a prior art gas encapsulated thermal conduction module 10. The thermal conduction module 10 provides cooling of the integrated circuit chips 12 contained therein. The chips 12 are mounted on one side of a substrate 14, generally made of ceramic, which has pins 16 extending from the other side thereof. The pins 16 provide for the plugging of the module into a board (not shown) which may carry connecting circuitry, etc. A housing cap 18 is attached to the substrate 14 by means of a flange 20 which extends from the periphery of the substrate 14 to the cap 18. The cap 18 is made of a good heat conductive material such as copper or aluminum. The cap 18 has small cylindrical openings 22 located therein, which are arranged in 3 by 3 arrays directly adjacent to the exposed surface of each chip 12. The openings 22 contain pistons 24 opposite each of the chips 12 in the module. The pistons 24 are made of a good heat conducting material such as aluminum or copper or alloys thereof. The cap 18 is in contact with a cold plate 30 which includes a channel 32 suitable for carrying a fluid coolant such as water.

Each of the pistons 24 has a head or header 26 at the end which contacts the surface of the chip 12 when the pin-piston is inserted into the adjacent opening 22 within the housing 18. A spring 27 is included between the housing 18 and the piston 24 to give a small force of the header 26 against the surface of the chip 12. The force exerted by the spring pressure is such that it will not cause the solder balls 28 on which the chips 12 are mounted to change shape.

In operation, heat generated by the chips 12 is extracted by the headers 26 and conducted by the pistons 14 to the cap 18 and the cold plate 30. As coolant flows through the channel 32, it carries away the heat from the cold plate 30, thereby extracting the heat from the integrated circuit chips 12 within the thermal conduction module 10.

While the thermal conduction module of FIG. 1 has provided a good solution to integrated circuit cooling problems, some aspects of the module lend themselves to improvement. In particular, the structural interrelationships between the pistons and the TCM cap can be critical to module performance.

SUMMARY OF THE INVENTION

It is an object of the present invention to enhance the cooling abilities of a liquid cooled electronic module.

The above object is realized by provision of a thermally optimized piston. The thermally optimized piston has three distinctive sections, an upper tapered section, a central cylindrical section, and a lower diverging header section.

In a preferred embodiment, the thermally optimized piston is provided as part of an improved electronic module. The improved electronic module includes enhanced convective cooling channels disposed between the pistons.

DESCRIPTION OF THE DRAWINGS

FIG. 2A is an isometric view of an improved piston according to an embodiment of the present invention.

FIG. 2B is a top view of the piston of FIG. 2A.

FIG. 2C is a side view of the piston of FIG. 2A.

FIG. 2D is a bottom view of the piston of FIG. 2A.

FIG. 3 is a side cutaway view of an improved thermal conduction module according to an embodiment of the present invention.

DESCRIPTION OF THE PREFERRED EMBODIMENTS

Figure 1:
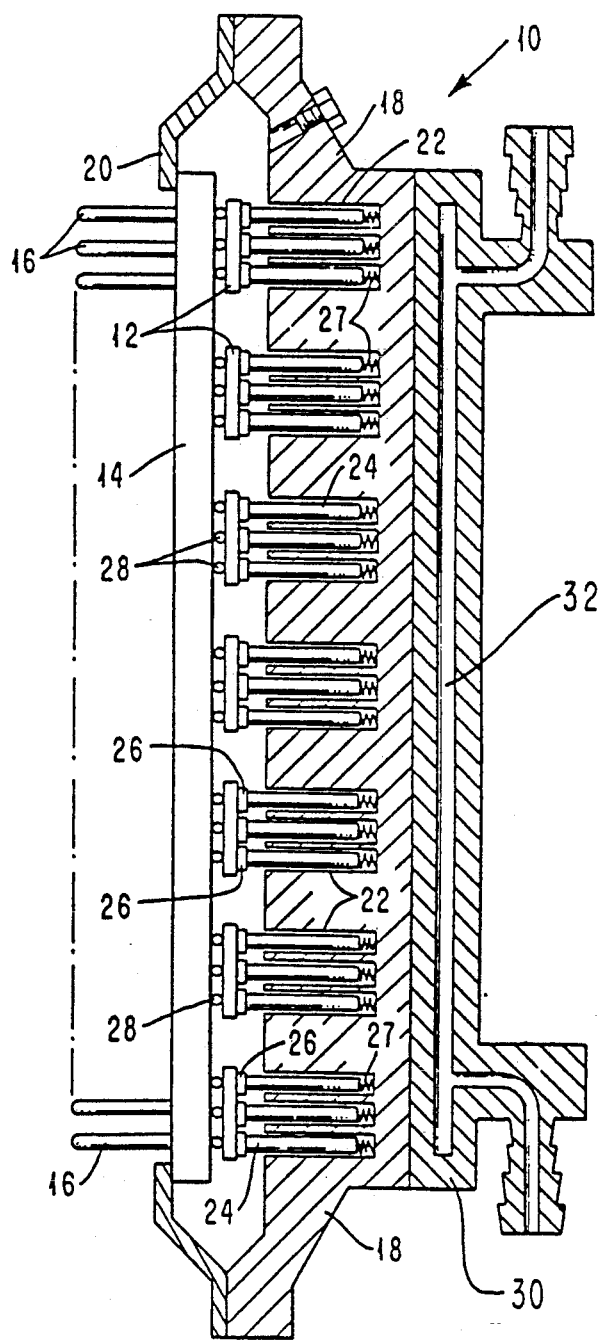
FIG. 1 is a cross sectional view of a prior art thermal conduction module.

This disclosure describes an improved piston and an enhanced thermal conduction module (TCM). The improved piston comprises three distinct sections, a converging section, a straight cylindrical section having a uniform cross section and a diverging header section which provides a rectangular surface for good thermal contact with the chip. This improved piston is referred to as a thermally optimized piston (TOP). In a preferred embodiment, the thermally optimized pistons are provided as part of an enhanced TCM which includes convective cooling channels formed in the TCM hat and disposed between the pistons in a closely coupled fashion. These convective cooling channels can include baffles, screens or pellets to enhance cooling.

FIG. 2A depicts an improved piston (TOP) according to an embodiment of the present invention. As discussed above, the thermally optimized piston 200 comprises three distinct sections. The first, upper section 202 is tapered with a slight converging angle toward the blind hole 208 (which is used to hold a spring). This angle accommodates chip tilt and manufacturing tolerances and minimizes the gap between the piston and its mounting hole when the piston is in place in an assembled TCM.

The central section 204 is cylindrical and maintains a uniform cross section. This cylindrical section is sized, in both length and diameter, to provide minimum clearance (allowing for chip tilt) with respect to the TCM hole wall when the piston is inserted.

The lower, chip contacting section 206 (the header) is shaped so as to diverge (taper away) from the central section 204, providing, for example, a square surface for contact with an integrated circuit chip (not shown). This lower header section maximizes the area of contact between the chip and the piston (thereby reducing the thermal resistance there between) and aids in the maintenance of a uniform temperature distribution along the face of the chip. FIGS. 2B and 2C are, respectively, top and side views of the piston of FIG. 2A.

As will be observed from FIGS. 2A and 2C, the improved piston includes a blind hole 208 in one end for receiving a conventional coil spring 210. The pistons are also optimized for best thermal performance per weight of the piston. An excessive piston mass requires high spring forces to prevent large impact loads on the chip if the module is vibrated or dropped. As the spring force is increased to accommodate a high piston mass, the probability of a mechanical failure of the solder ball joints (which connect the chip to the substrate) also increases. Thus, the improved piston is provided with a second hole 212 for weight reduction. The second hole is preferably disposed coaxially below the blind hole.

Turning again to FIGS. 2A and 2C, it will be observed that the top can be provided with a lubrication groove 214, located on the side. The lubrication groove 214 runs across the upper and central sections 202, 204. This groove 214 facilitates the flow of an interfacial media (such as oil) to the top of the piston and to the annular space surrounding the piston. The groove 214 also facilitates the removal of the piston in the presence of a relatively high viscous fluid (such as synthetic oil) by acting as a vent.

A bottom view of the piston of FIG. 2A is illustrated in FIG. 2D. As illustrated in FIG. 2D, lubrication channels 216, 218 can be provided on the face of the piston header 206. These channels are particularly useful in applications having very large chips and/or poor wetting fluids, in that they provide conduits for the interfacial media to flow between the chip and the piston face during the module filling operation. Surface tension of the fluid provides the mechanism by which the fluid leaves the lubrication channels and fills the sub-micrometer gap between the chip and piston.

FIG. 3 is a side, cutaway view of an improved thermal conduction module including thermally optimized pistons 302 and closely coupled convective cooling channels 304 in a four piston per chip embodiment. By "closely coupled", it is meant that 1) the walls between the cooling channels 304 and the pistons 302 are as thin as manufacturing tolerances and the structural rigidity of the TCM material will allow, without ballooning under the pressure of the coolant under a worst case analysis; and 2) the channels are as deep into the TCM (as close to the feet of the pistons) as manufacturing tolerances and the structural strength of the TCM material will allow, without perforating or bursting under a worst case coolant pressure analysis. As an example, where the TCM is made of oxygen free copper, both the side and bottom channel walls could have a thickness of 0.5 mm.

As is conventional, the module of FIG. 3 includes an array of integrated circuit chips 306 mounted to a substrate 308 by way of solder balls. The substrate 308 includes pins which can be used to establish electrical connection to a mother board 310 which provides interconnection between chips within different modules. In the view of FIG. 3, only the outlet 312 is shown inasmuch as the inlet would be on the portion of the module which is cut away. Blind holes 314, for receiving the pistons 302, are provided in the material between channels 304.

Figure 4:
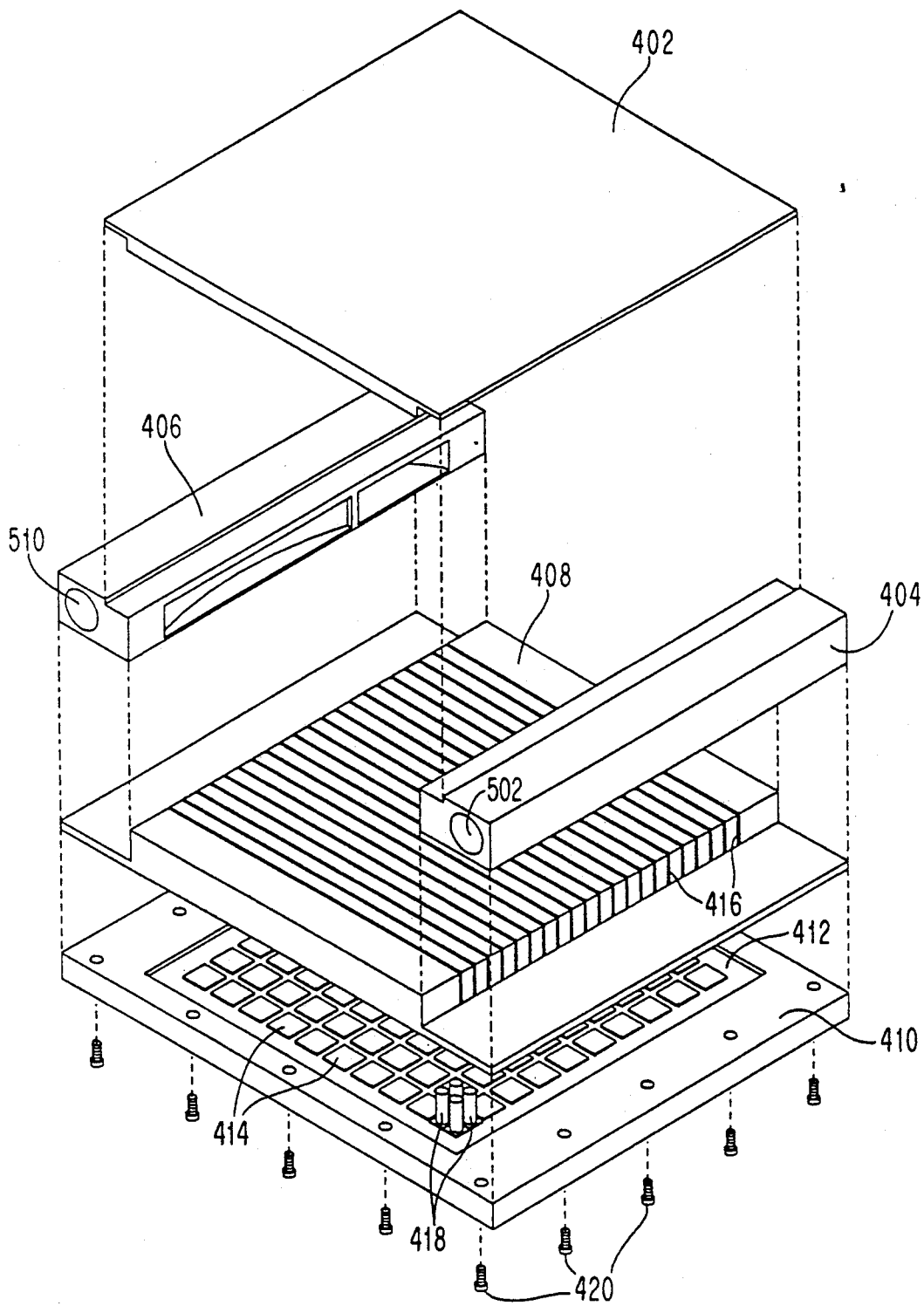
FIG. 4 is an assembly drawing of an improved thermal conduction module of the type illustrated in FIG. 3.

An assembly drawing of an improved thermal conduction module of the type illustrated in FIG. 3 is depicted in FIG. 4. The module of FIG. 4 comprises a cover plate 402, inlet and outlet distributor blocks 404, 406, a channel section 408, and a frame 410 for carrying a substrate 412. The substrate 412 has an array of integrated circuit chips 414 mounted therein. The channel section 408 and the pistons 418 are preferably made from a good heat conducting material such as copper. The channel section 408 includes a plurality of parallel channels 416 which are formed deeply into the section but do not pierce the bottom (which faces the substrate 412 when the module is assembled).

During assembly, the cover plate 402, the inlet distributor block 404, the outlet distributor block 406 and the channel section 408 are brazed together, as illustrated, to form an integral cooling structure. Blind holes (not shown) for receiving the thermally optimized pistons 418 are then drilled into the underside of the channel section 408 (in the material between the channels 416). Next conventional coil springs are inserted into the blind holes 208 of the pistons 418 (as illustrated, for example, in FIG. 2C) and the pistons (with the springs inserted) are placed into the blind holes previously drilled into the underside of the channel section 408.

After the pistons (with springs in place) have been inserted into the channel section blind holes, the substrate 412 is placed into the frame 410. The frame 410, with the substrate in place, is then fastened to the integral cooling structure (by way of screws 420) so as to cause the pistons to contact the chips. A hermetic seal is made by a C ring (not shown) located between the frame and the integral cooling structure. Once assembled, the sealed module is evacuated and then backfilled with a thermally conductive fluid (such as oil) that will exist interstitially between the chip and piston, and in between the piston and the integral cooling structure.

Figure 5:
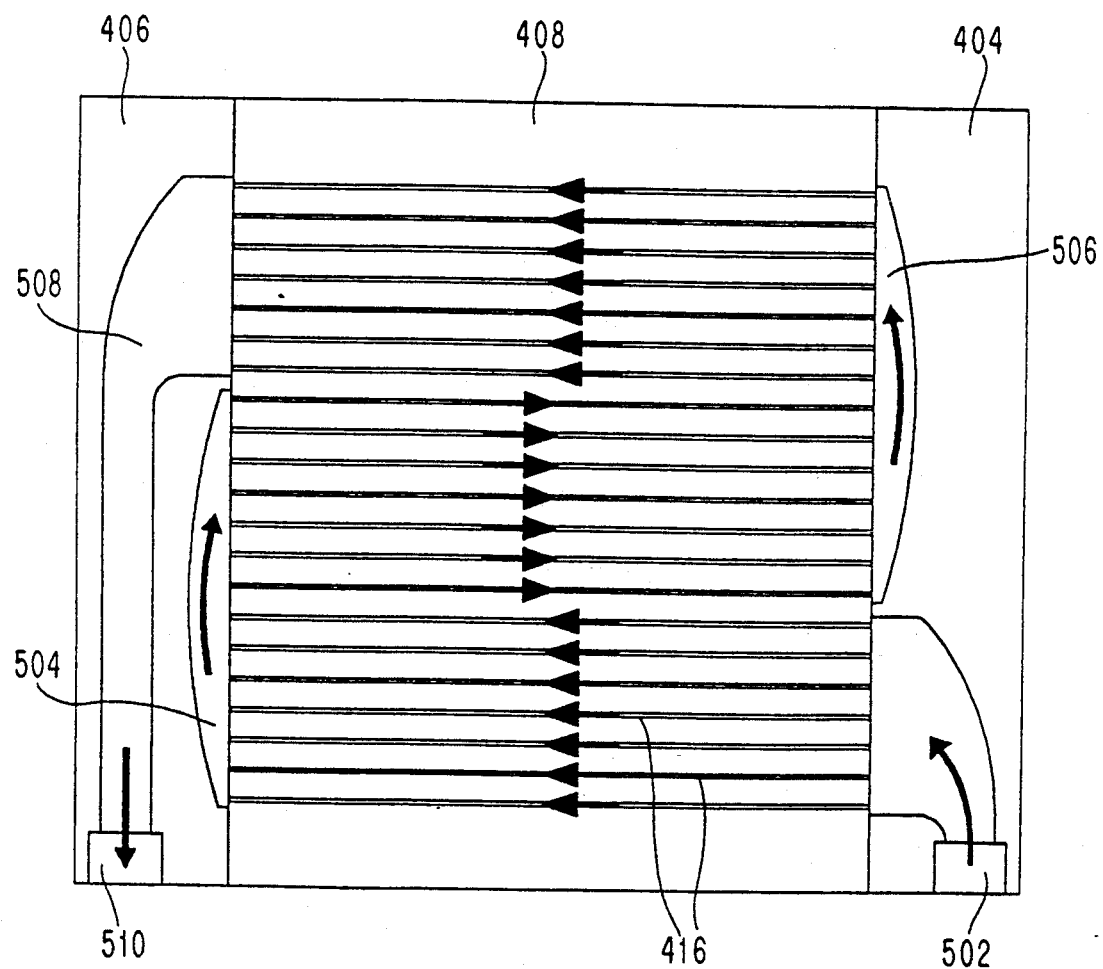
FIG. 5 is a top cutaway view of the integrated cooling structure provided in the module of FIG. 4.

FIG. 5 is a top cutaway view of the integral cooling structure of FIG. 4 showing the inlet distributor block 404, the outlet distributor block 406 and the channel section 408. The arrows represent the coolant flow path. A series/parallel flow configuration is preferred in order to provide maximum heat transfer performance given flow rate and pressure drop constraints.

In the integral cooling structure of FIG. 5, a coolant, such as water, enters the module through an inlet 502 and is distributed, in parallel, to a first end of seven of the channels 416. At the other end of the seven channels, the coolant is collected and redistributed, in parallel, to a second bank of seven channels, by a first flow distributor 504 formed in the outlet distribution block 406. Similarly, a second flow distributor 506 formed in the inlet distribution plate 404 collects the coolant flowing out of the second bank of channels and redistributes it, in parallel, to a final bank of seven channels. The coolant flowing from the output of the last bank is recollected, by a collector 508 formed in the outlet distribution block and expelled through an outlet 510. The inlet 502 and outlet 510 are also shown in the assembly drawing of FIG. 4.

The first and second flow distributors 504, 506 are machined, respectively, as concavities into the outlet and inlet distribution blocks 406, 404. As illustrated in FIG. 5, the flow distributors 504, 506 each include a diverging section, which receives the incoming coolant flow from a bank of seven channels, and a converging section, which redistributes the received coolant to another bank of seven channels. The diverging/converging shape of the flow distributors 504, 506 provides uniform flow to the fed channels (i.e. all of the channels supplied with coolant by a given distributor will receive the coolant at the same flow rate) and minimizes stagnation and eddy regions which would otherwise contribute to pressure drop. The shape of the flow distributors 504, 506 also aids in the purging of air during start up.

Figure 6:
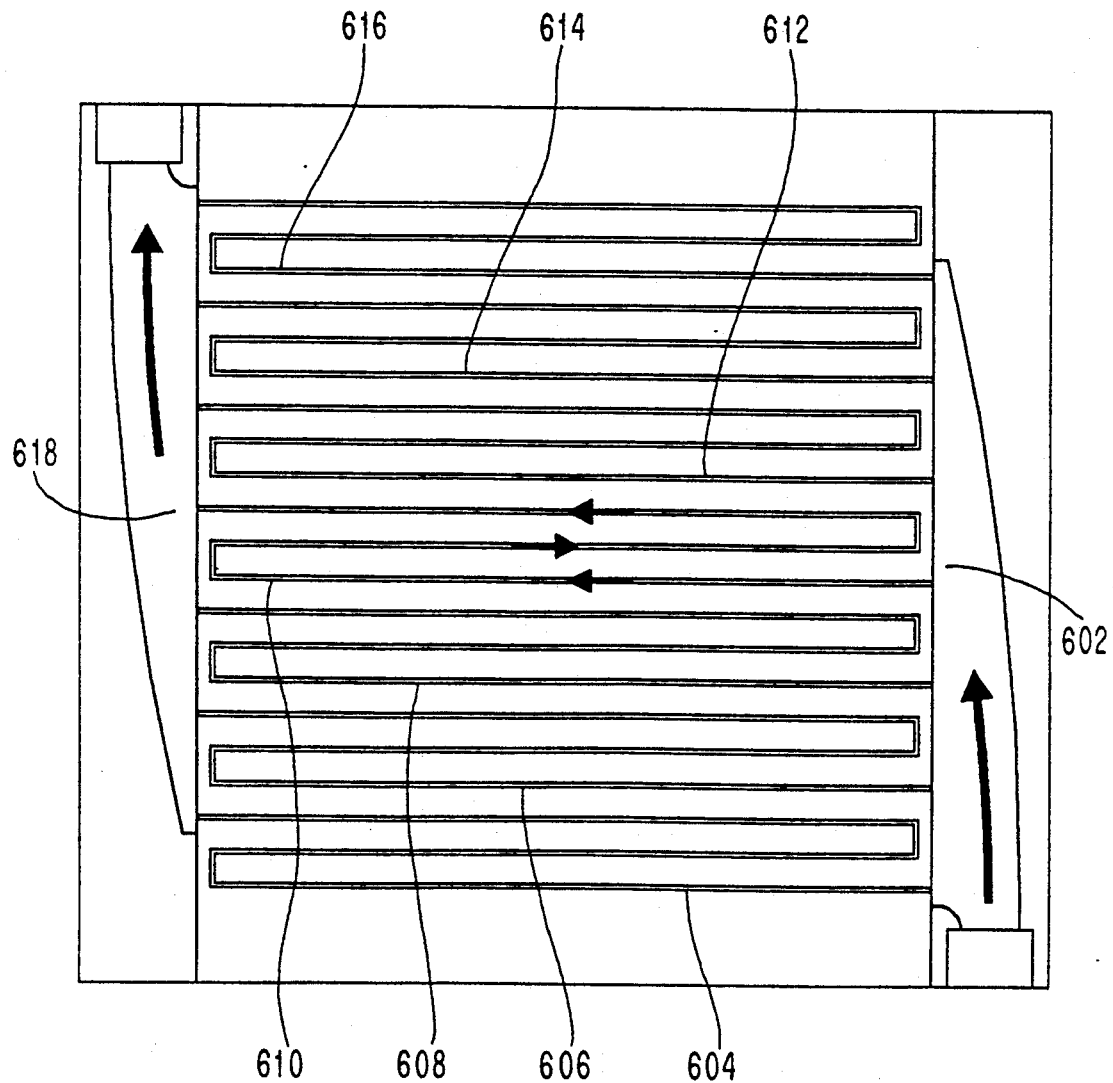
FIG. 6 is a top cutaway view of a first alternative embodiment of the integrated cooling structure of FIG. 4.

FIG. 6 illustrates an alternative embodiment of an integrated cooling structure which provides a different coolant flow path from the one illustrated in FIG. 5. In the embodiment of FIG. 6, a single inlet distributor 602 (formed in the inlet distribution block) causes the coolant to flow, in parallel, through seven sets of three channels in series 604-616. The coolant is collected by a single collector 618 formed in the outlet distribution block and expelled from the module. Similar to the embodiment of FIG. 5, the inlet distributor 602 and outlet collector 618 work together to provide uniform coolant flow to the channels and to minimize pressure drop.

Figure 7:
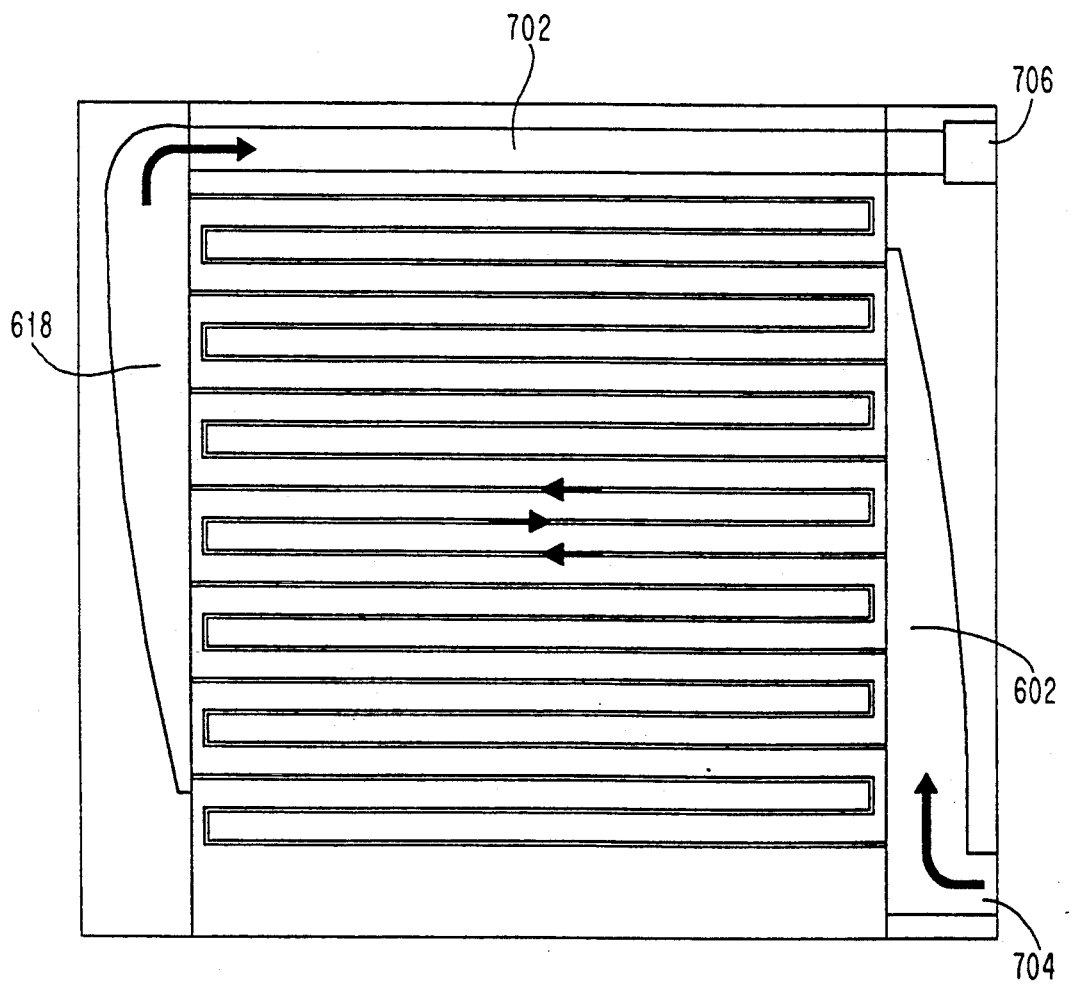
FIG. 7 is a top cutaway view of a second alternative embodiment of the integrated cooling structure of FIG. 4.

FIG. 7 illustrates one of several ways that coolant can be brought into and out of the module. For example, an outlet channel 702 can be provided in the extra material of the channel section so that both the inlet 704 and the outlet 706 are on the same side of the integral cooling structure.

Figure 17:
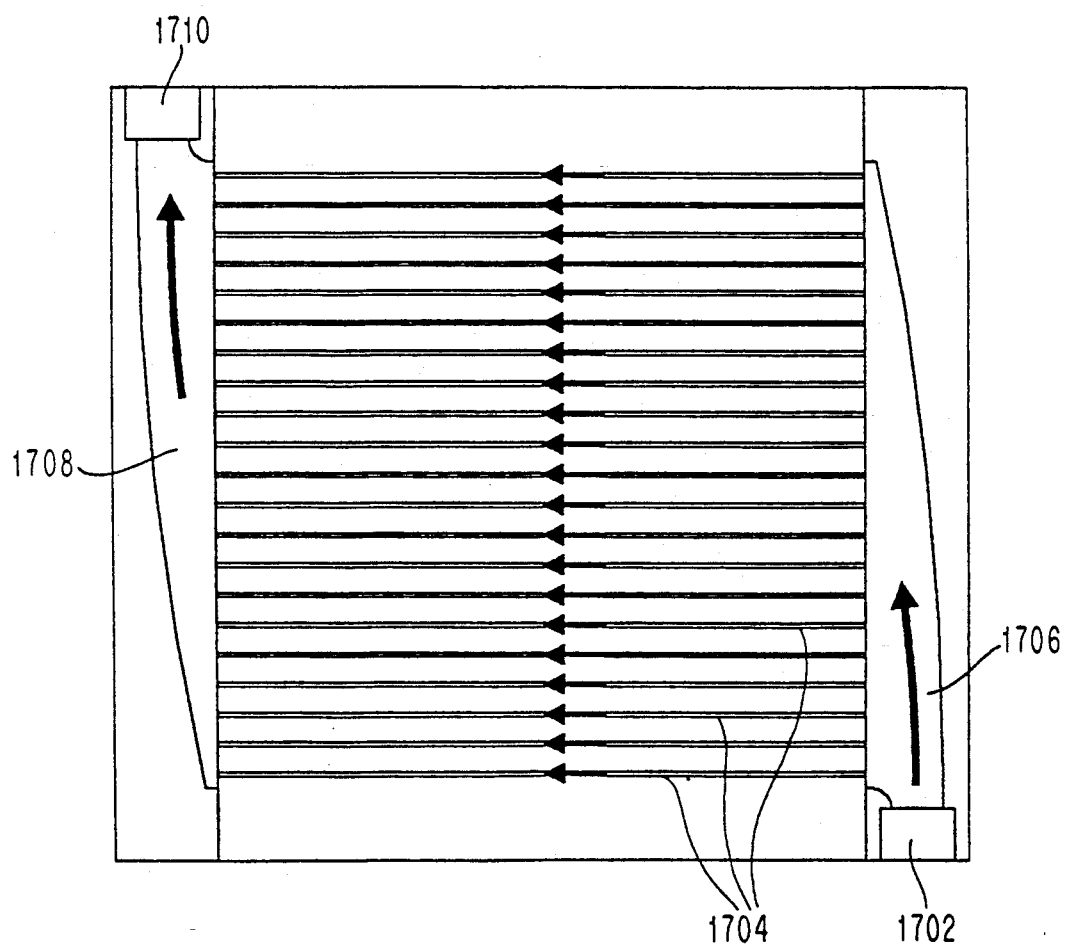
FIG. 17 is a top cutaway view of a third alternative embodiment of the integrated cooling structure of FIG. 4.

FIG. 17 illustrates yet another alternative embodiment of an integral cooling structure which uses a straight parallel flow path. In the embodiment of FIG. 17, the coolant enters module through an inlet 1702 and is distributed to a number of parallel channels 1704 by way of a distributor 1706 formed in the inlet distribution block. As will be observed from FIG. 17, the inlet distributor 1706 converges from toward the channels as a function of distance from the inlet. The coolant flows across the channels 1704, in parallel, until it reaches the outlet collecter 1708 which is formed in the outlet distribution block. The outlet collector 1708 diverges from the channels as a function of distance from the outlet 1710. The outlet collector collects the coolant and expels it from the outlet 1710.

Figure 15:
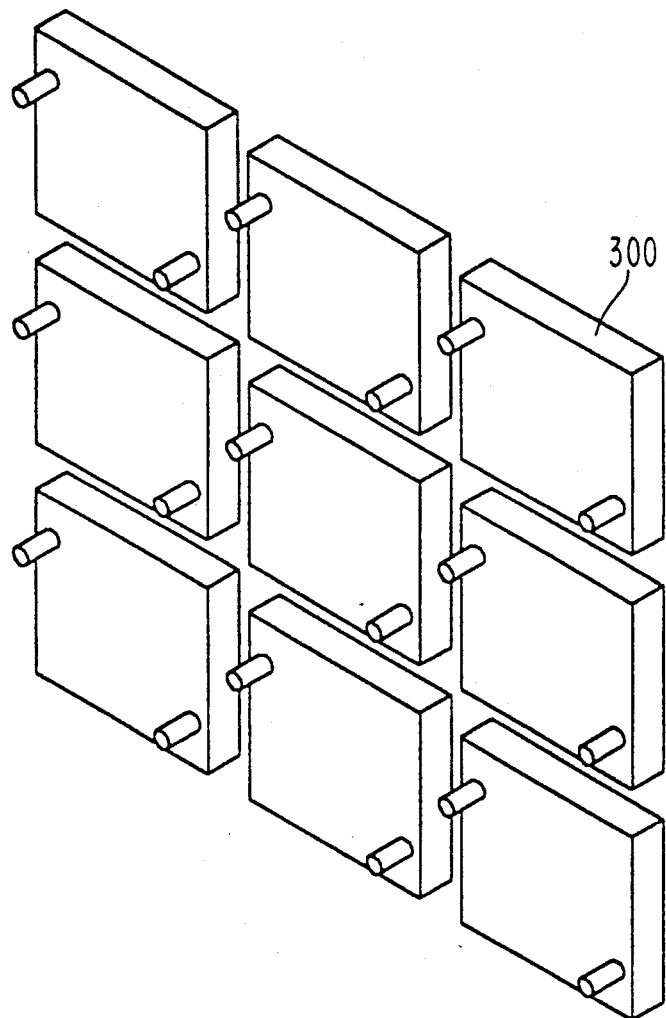
FIG. 15 is an isometric view of a plurality of the modules of FIG. 3 configured in a planar fashion.
Figure 16:
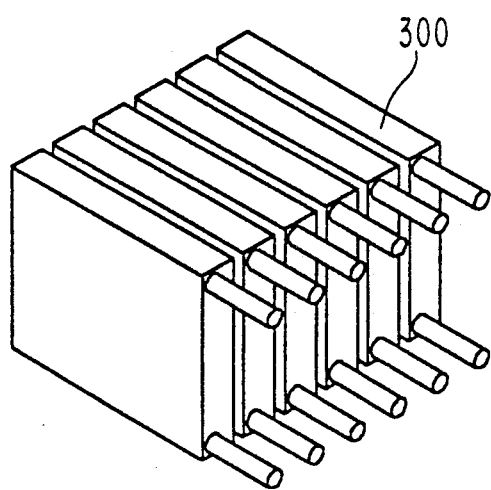
FIG. 16 is an isometric view of a plurality of the modules of FIG. 3 configured in a stacked or three dimensional fashion.

The aforedescribed modules can be configures in a variety of fashions. FIG. 15 is an isometric view of a plurality of the modules 300 of FIG. 3 configures in a planar fashion. FIG. 16 is an isometric view of a plurality of the modules 300 of FIG. 3 configures in a stacked or three dimensional fashion.

Alternative methods of manufacturing the channel section 408 will now be described. As a first alternative, the channel section 408 (FIG. 4) can be machined from a solid block of material. The channels 416 can be cut into the block in a conventional manner and rows blind holes for the pistons can be drilled into the other side of the block in the material between the channels.

Figure 8:
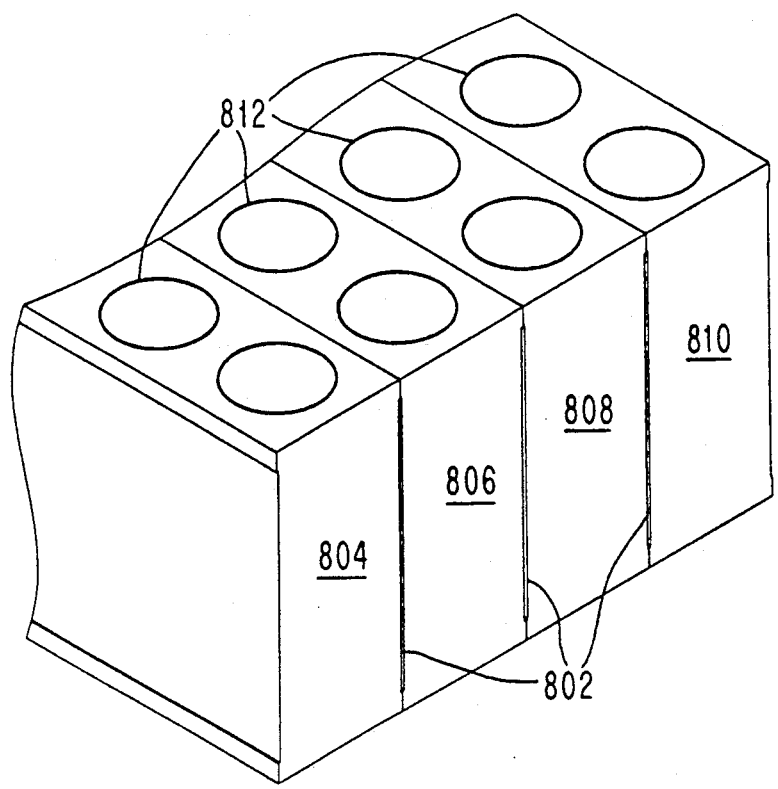
FIG. 8 is an isometric/bottom view of a portion of a channel section manufactured using separate parts.

While the above manufacturing method is relatively inexpensive, conventional machining of the channels limits the minimum attainable channel width from a practical standpoint. As an alternative to machining, the channel section can be formed by E-beam welding a plurality of separate bars or sections. FIG. 8 is an isometric/bottom view of a portion of a channel section manufactured using separate parts.

In the embodiment of FIG. 8, each column of pistons is accounted for by its own block of material in which columns of piston holes 812 are drilled. The sides of the blocks that are parallel and run along the lengths of the piston holes are machined in such a manner such that when they are joined together, channels 802 for coolant flow are formed. Looking at FIG. 8, it will be observed that each of the channel sections 804-810 is "I" shaped. It should be understood, however, that the end sections (not shown) need not be I shaped but can instead have smooth/flat surfaces on the side that faces the outer side of the channel section.

The joining of the blocks 804-810 is preferably accomplished by E-beam welding, a penetrating weld that insures that the coolant is kept away from the electronics. This method of joining does not alter or soften the bulk material as brazing would. Advantageously, the region of metal where the piston holes are to be drilled remains hard, which allows for machining to tighter tolerances.

Figure 9:
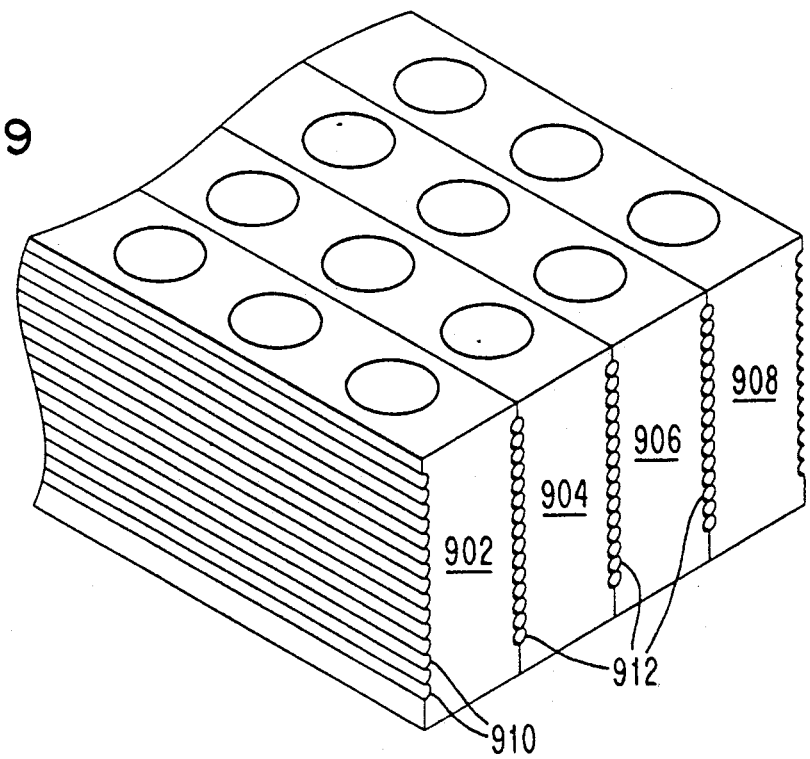
FIG. 9 is an isometric/bottom view of a portion of an alternative embodiment of the channel section.

Manufacturing the channel section by joining separate blocks also enables various channel enhancements. FIG. 9 is a cutaway view of a channel section illustrating one such enhancement. In the embodiment of FIG. 9, the channel surfaces of each of the blocks 902-908 have been machined to include a plurality of parallel semicircular canals 910 such that when the sections are joined the resulting channels are in the form of rows of circular flow tubes 912. The advantage of the embodiment of FIG. 9 is that their is approximately a 70% increase in heat transfer area as compared with the rectangular channel embodiment (of FIG. 8) where the base width of the channel is equal to the diameter of the tube. The heat transfer coefficient for a given flow rate is similar for both embodiments. Just as with the embodiment of FIG. 8, the sections 902-908 are preferably joined by E-beam welding.

The manufacturing technique of joining separate blocks or bars by E-beam welding also has a number of other advantages. For a turbulent flow regime: 1) Channels can be made narrower, enabling larger piston holes to be machined and larger pistons inserted) and thereby increasing heat transfer performance; 2) The channel walls can be made stiffer. For example, the blocks can be made "E" shaped as opposed to I shaped. These walls will be more resistant to distortion forces induced by machining the piston hole or by high fluid pressures (as used, for example, during pressure tests of the module); 3) The channel surfaces can be more easily treated for material compatibility and for fouling (e.g. by metallic alloy plating; 4) The channel walls can be machined to provide various kinds of extended surfaces for heat transfer (e.g. as illustrated in FIG. 9).

Figure 14:
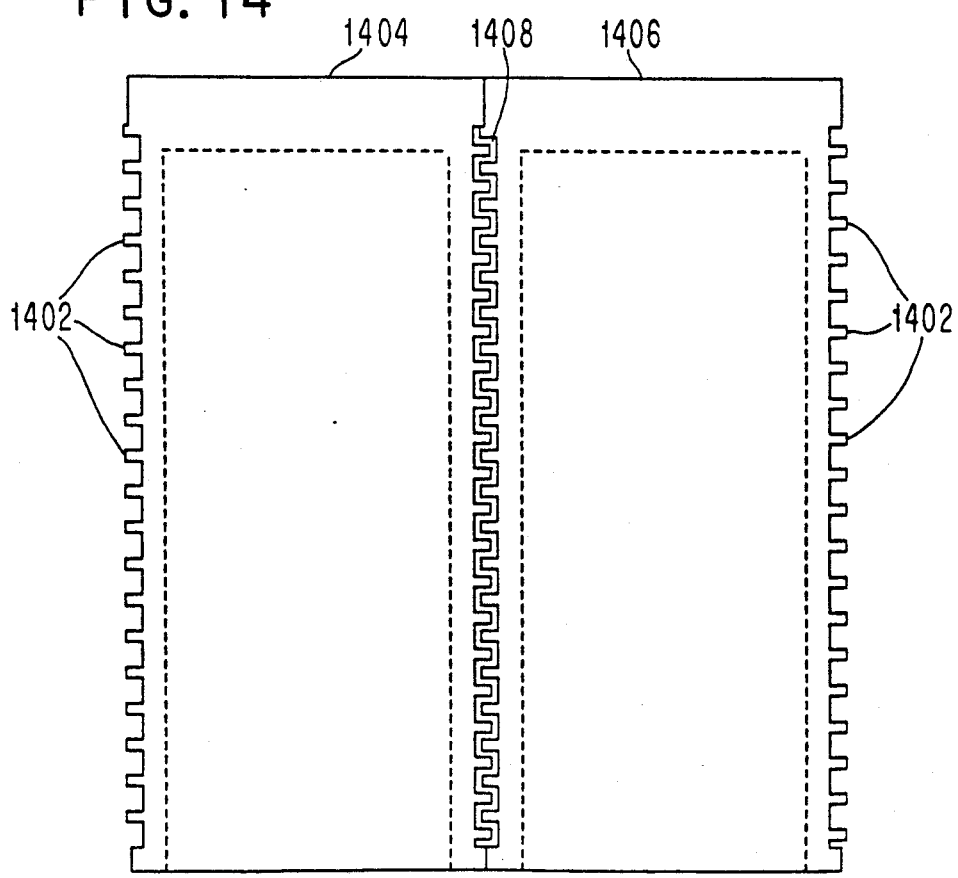
FIG. 14 is a side cutaway view of a channel section manufactured using separate parts which, when joined together, form narrow channels having interweaved fins.

The above-described block-joining manufacturing technique is advantageous for a laminar flow regime as well (i.e. Reynolds number of less than 2300 based on the hydraulic diameter of the channel). For example, as illustrated in FIG. 14, extended fins 1402 can be machined on the sides of the blocks 1404, 1406 such that when the blocks are joined together the fins interweave to form extremely narrow channels (as illustrated, for example, by reference numeral 1408). By extremely narrow, it is meant that the channels have a width of 0.3 mm. or less. A practical optimum for the channel width, given the desire to achieve a reasonable pressure drop (for example about 10-12 psi) and a reasonable temperature rise (about 5 degrees Celsius) across the fluid is 0.25 mm.

Figure 20:
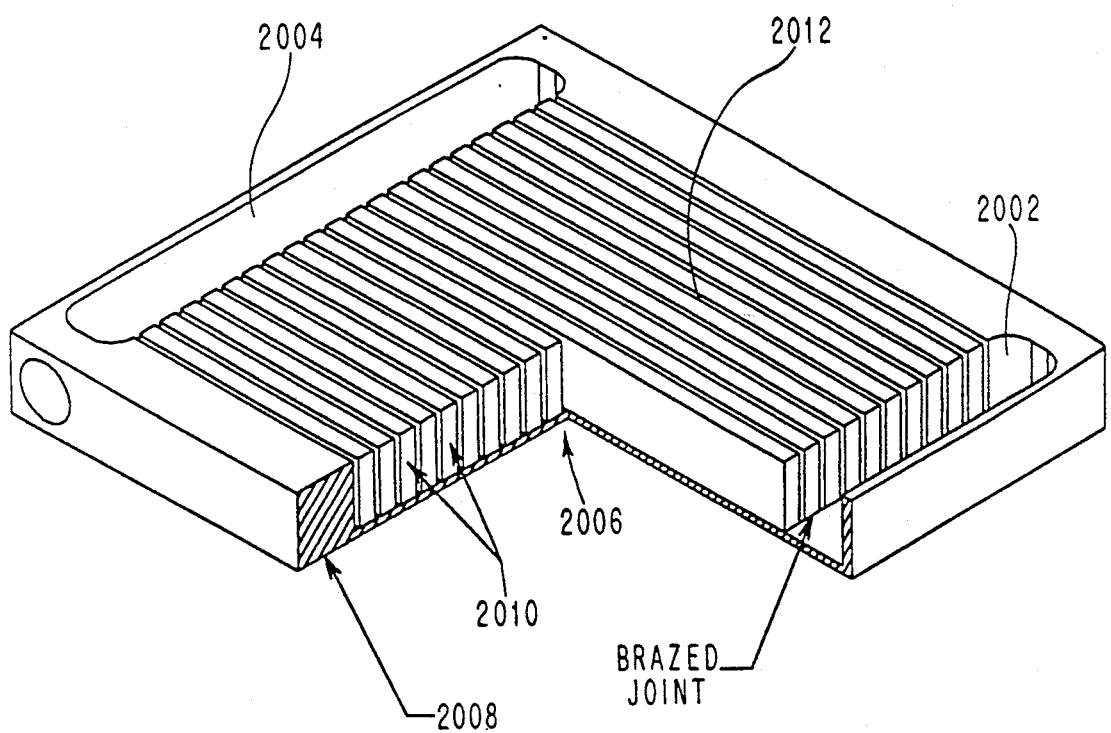
FIG. 20 is an isometric cut away view of an embodiment of an integral cooling structure, manufactured using an alternative method.

An alternative method of manufacturing the entire integral cooling structure will now be explained by reference to FIG. 20. First, an inlet manifold 2002, an outlet manifold 2004 and a center section 2006 are formed by hollowing out portions of a solid block of material (e.g. oxygen free copper). This hollowed out block forms a base section 2008. Next, rectangular blocks 2010 of the material are, positioned in the center section 2006 in such a manner so as to have spaces in between, thus forming channels 2012 for coolant flow between the inlet and outlet manifolds 2002, 2004. Next, a cover plate (not shown), which covers the entire base, is brought down over the base 2008 and the blocks 2010. The blocks 2010 and the base 2008 are then brazed together. Holes for pistons (not shown) are then drilled through the bottom of the base and into the blocks.

One important aspect of efficient heat transfer is establishing a good thermal interface between the pistons and the surface of the chips. The process of making circuits the surface of a wafer causes chip curvature and waviness. In addition, thermal expansion of the chip upon heating is unequal since the powered circuits are typically only located on one side of the chip. Therefore, the chip surface in contact with the pistons is typically not flat. The degree of flatness is related to chip size. Thus, for large chips, the use of multiple TOPs, as shown in FIGS. 10A and 10B, is desirable.

Figure 10A:
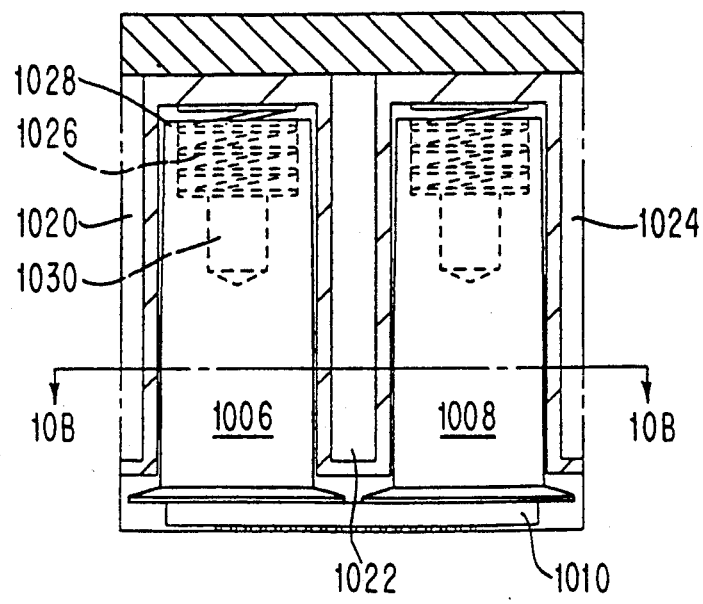
FIG. 10A is a side cutaway view of an arrangement for cooling chips by using four of the pistons, of the type illustrated in FIG. 3, per each chip.
Figure 10B:
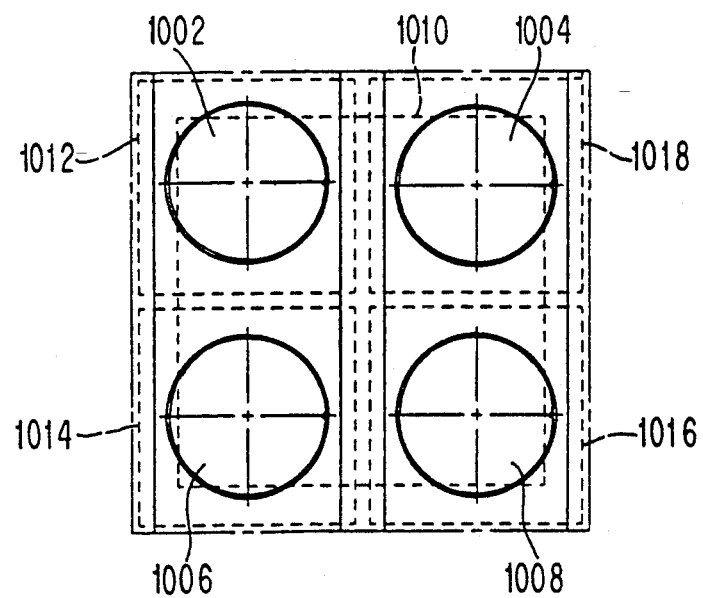
FIG. 10B is a top view of the arrangement of FIG. 10A taken along line 10B—10B.

FIGS. 10A and 10B illustrate an arrangement for cooling chips by using four thermally optimized pistons 1002-1008 per chip 1010. Each thermally optimized piston has a diverging header with a square chip contacting surface 1012-1018 having lubrication channels. Convective cooling channels 1020-1024 are located within the hat, between each row of pistons. A liquid coolant (e.g. water) flows through the channels and channel heat removal rate is determined by the volumetric flow and the channel dimensions. As discussed with respect to FIGS. 2A-2D, each piston includes a coil spring 1026 and coaxially disposed blind holes 1028-1030.

Figure 18B:
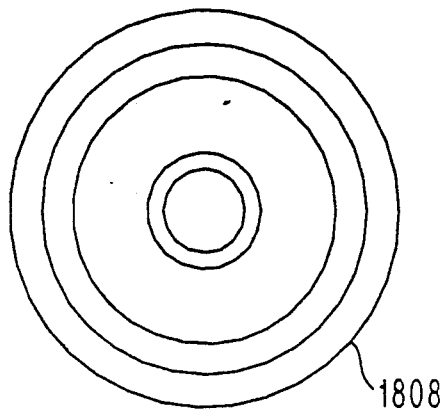
FIG. 18B is a top view of the piston of FIG. 18A.
Figure 18A:
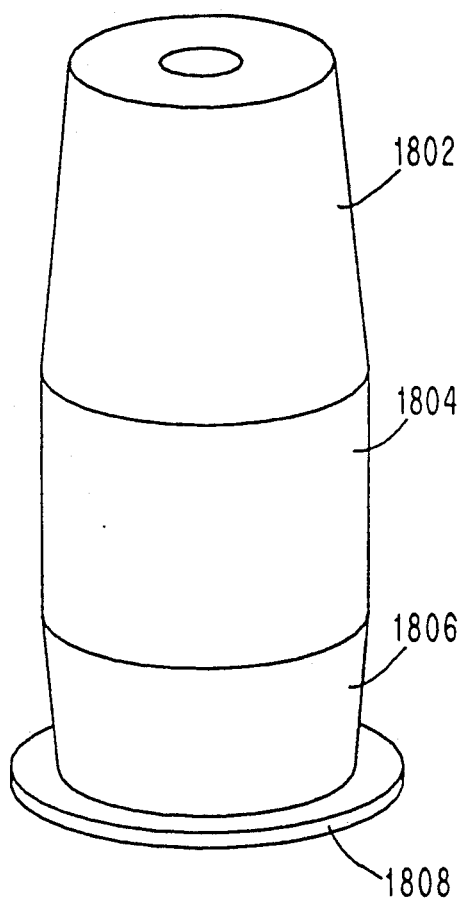
FIGS. 18A is an isometric view of an improved piston suitable for single piston per chip applications.
Figure 18C:
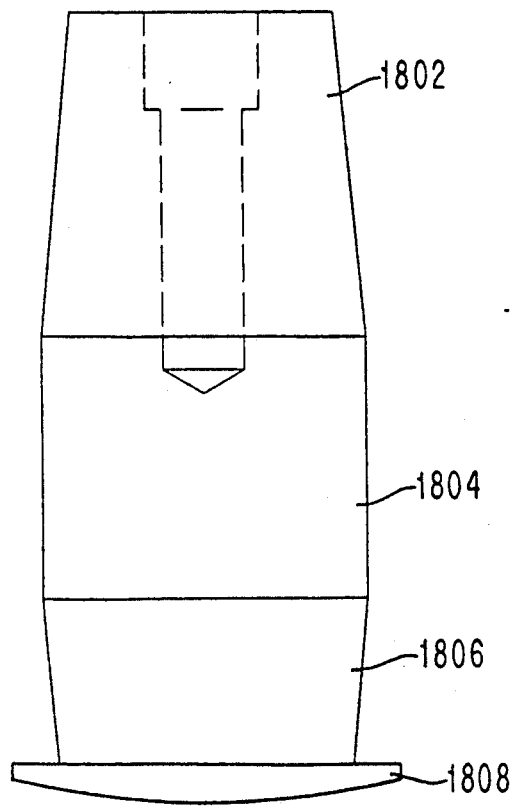
FIG. 18C is a side view of the piston of FIG. 18A.

In some applications, manufacturability concerns favor a single piston per chip embodiment (in contrast with the four piston per chip embodiment of FIGS. 3, 10A, 10B). In that case, the optimum piston length will be longer than in a multiple piston embodiment. The piston configuration giving optimal thermal performance in this single piston embodiment is illustrated in FIGS. 18A-C. The piston of FIGS. 18A-C includes a long tapered region 1802 on the piston end not in contact with the chip, a cylindrical region 1804 which is as long as permitted by the chip curvature or tilt considerations, and a shorter tapered region 1806 on the piston end contacting the chip surface. Typically, an optimal taper would have the longer tapered region 1802 from 2 to 3 times as long as the shorter tapered region 1806.

As previously mentioned, the chip surface tends to be spherically concave in use on the substrate. For large chips, this curvature is sufficient to leave a large gap between a single piston having a flat face and the center of the chip. This gap results in a hot spot at the center of the chip. Two alternative means of eliminating or reducing this hot spot in single piston per chip embodiments will now be described.

As a first alternative, the piston can be provided with a chip contacting header 1808 which is machined into a spherical crown having a radius of curvature approximating that of the chip surface. While in various applications it might be advantageous to provide a piston with a crown having a radius of curvature slightly larger or smaller than that of the chip surface, significant deviation can cause problems. For example, providing a crown of significantly larger radius of curvature than that of the chip will not eliminate the hot spot at the chips center. Similarly, providing the piston with a crown of a significantly smaller radius of curvature than that of the chip will result in hot spots along the chips edges or corners.

In some instances, it could be impractical to make a tool of large enough radius to approximate that of the chip curvature. In such instances a flat diamond tool can be tilted at a slight angle to create a slight conical face on the chip header 1808. The center of the conical face can also be truncated (i.e. flat in the center).

Figure 19A:
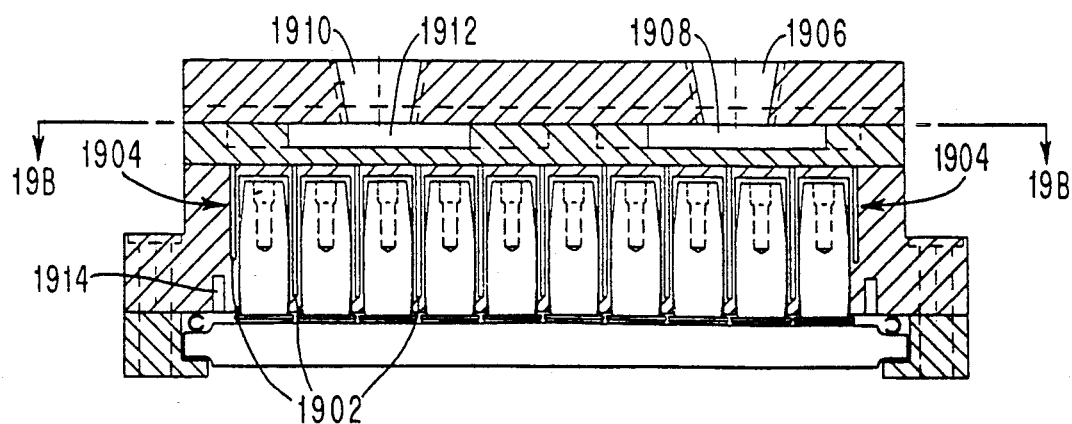
FIG. 19A is a side cut away view of an improved thermal conduction module having pistons of the type illustrated in FIG. 18A.
Figure 19B:
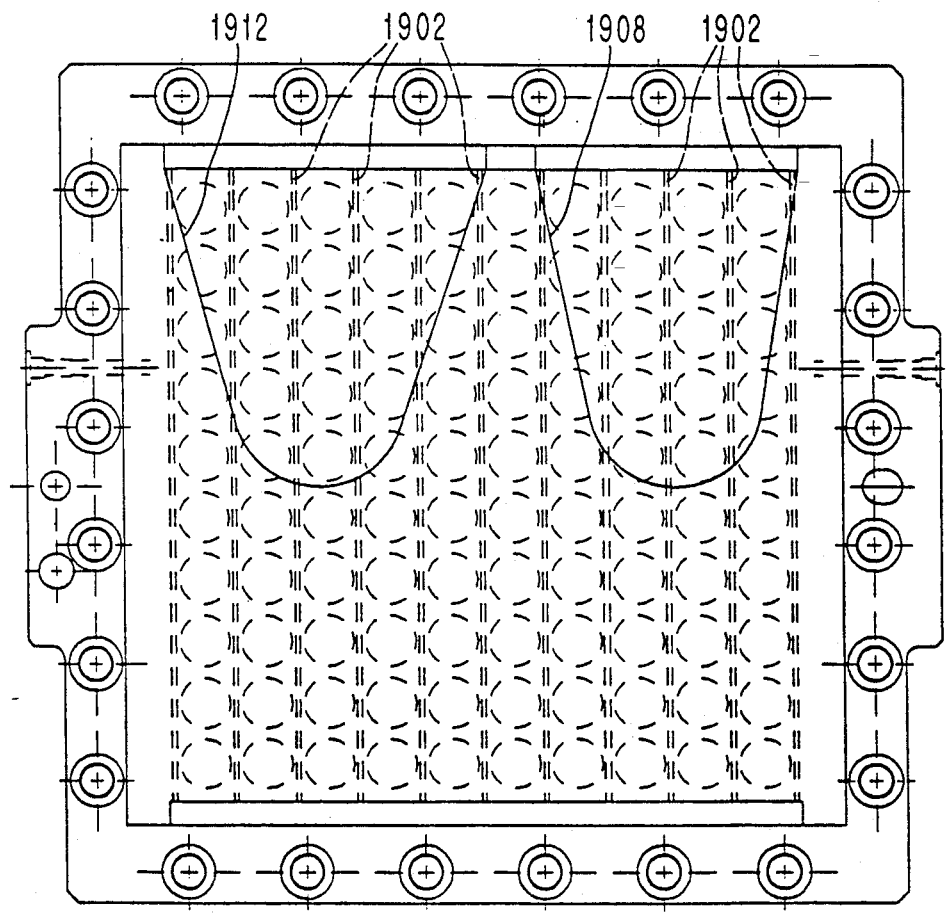
FIG. 19B is a top cutaway view of the module of FIG. 19A taken along line 19B—19B.

FIGS. 19A-B depict an embodiment of an improved thermal conduction module using the piston of FIGS. 18A-C in a one piston per chip configuration. The depth of the convective cooling channels 1902 is reduced along the edges 1904 for oil expansion space 1914 and to keep from over cooling the outer row of the chip sites. Also, the ends of each channel can have curvature to facilitate saw cut tool requirements and to keep chip sites at ends of the channels from being over cooled. As illustrated in FIG. 19B, the channels are arranged in a serial/parallel multi-pass fashion. For certain applications, a top manifold is preferred. The inlet 1910 has an increasing width entrance manifold 1912 to ensure uniform flow to each channel. Similarly, the outlet 1906 has a decreasing width exit manifold 1908 for collection of the coolant.

From FIG. 19B, it will be observed that fewer channels are used in the second pass (the pass in which the coolant returns to the outlet) than in the first pass. Specifically, 6 channels are used in the first, incoming, pass while only five channels areas used in the second pass. The smaller number of channels create a higher coolant velocity during the second pass than existed for the first pass. Advantageously, increased heat transfer, due to the increased velocity in the second pass, will tend to counteract the negative heat transfer effects of increases in coolant temperature that occur during the first pass. In embodiments with more than two passes, the module can be designed so that each subsequent cooling pass encompasses less channels than the preceding pass.

Figure 11:
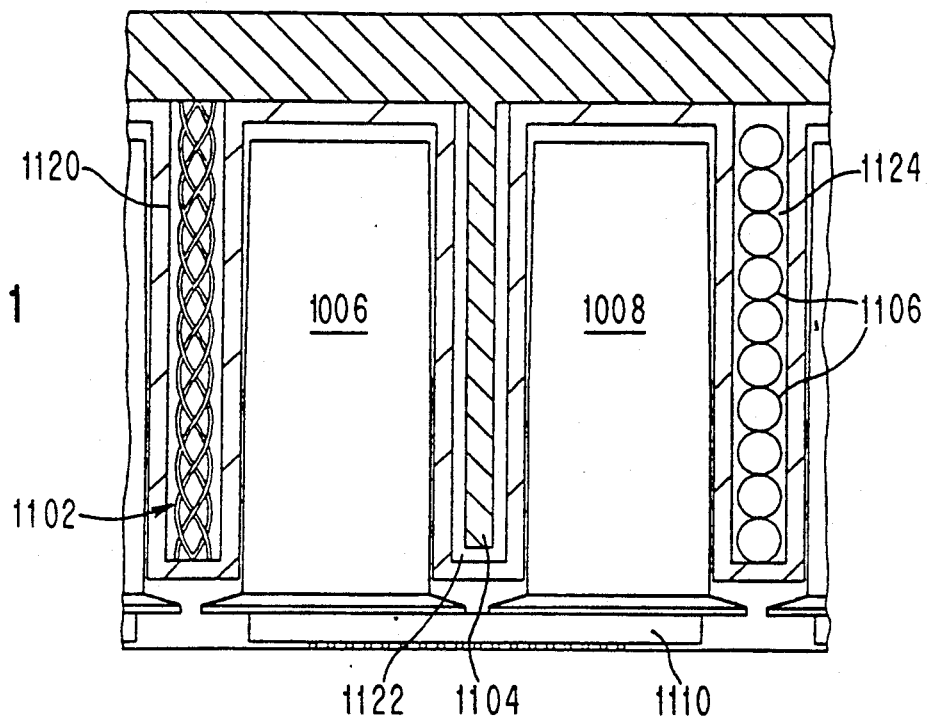
FIG. 11 is a side cutaway view of a piston cluster configured in a module having enhanced flow passages.

As previously discussed, a larger water heat removal rate is realized by enhancing the convective cooling channels. This can be accomplished as previously described with respect to FIGS. 9 and 14 or by placing material into the channels as depicted in FIG. 11. FIG. 11 shows three different types of channels enhancements. Although illustrated in a multiple piston per chip environment (i.e. four TOPs 1006, 1008 and two cut away contact each chip 1110), it should be understood that these enhancements are also applicable to single piston per chip embodiments.

As depicted in FIG. 11, The left channel 1120 contains a screen 1102 (a woven wire mesh), the center channel 1122 has a baffle 1104, and the right channel 1124 is filled with flow control pellets 1106. The addition of a screen 1102 provides greater heat transfer performance since the water passage is more complex. As a result, turbulence is created and the water is thoroughly mixed.

The center channel 1122 is split into two small channels by a flow control baffle 1104 extending into the main channel from the hat. The baffle 1104 reduces the hydraulic diameter of the channels and increases the fluid velocity. Each of these factors has the effect of increasing the heat removal capability of the channels. The baffle extends downward into the depth of the channel and can run the entire channel length. Alternatively, the baffle can be lengthwise interrupted by small cuts so that the boundary layer of coolant is continuously destroyed. The baffle strips can also be bent in an alternating pattern such that the bulk fluid is deflected onto the channel walls.

The right hand channel 1124 is filled with small pellets 1106 having a diameter nearly as large as the channel width. As a result, the heat removal rate from the channel wall will be enhanced by the turbulence created by the pellets.

Figure 12:
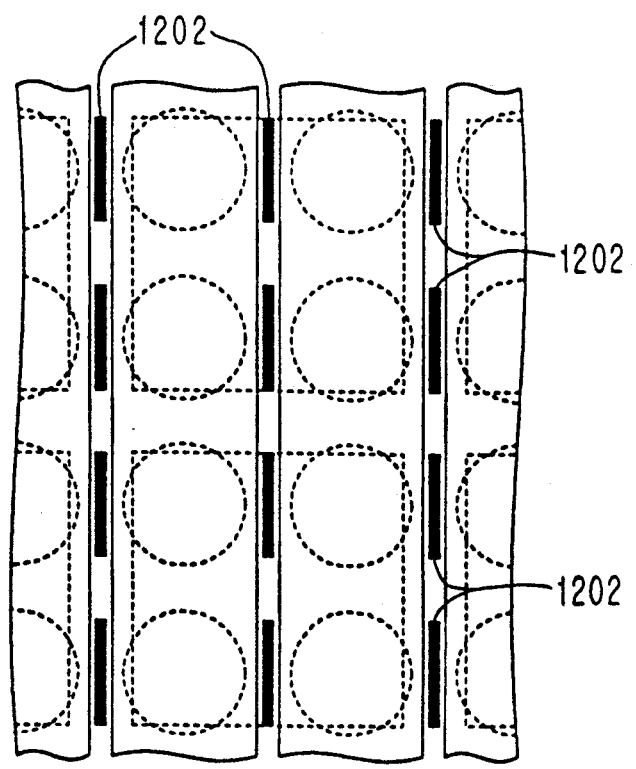
FIG. 12 is a top cutaway view of a channel section section, having channels with periodic flow turbulators.
Figure 13:
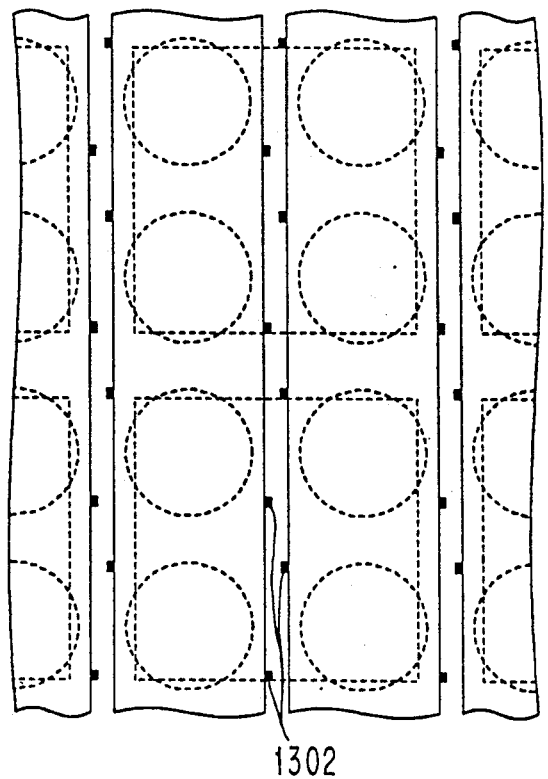
FIG. 13 is a top cutaway view of a channel section having channels with periodically alternating turbulator ribs.

Other enhancements to the channels can also be made. For example, FIG. 12 is a top cutaway view of a channel section showing channels having periodic turbulators 1202. A further alternative having channels including periodically alternating turbulator ribs 1302 is illustrated in FIG. 13.

Any one of the above enhancements can be used alone or in combination with the others depending on the desired heat removal performance in a given area of the TCM and the pressure drop limitations of the coolant delivery system.

Many other modifications and variations that do not depart from the scope and spirit of the invention will now become apparent to those of skill in the art. Thus, it should be understood that the above-described embodiments of the invention have been described by way of example and not as a limitation.

Having thus described out invention, what we claim as new and desire to secure by letters patent is:

1. An electric circuit cooling module, comprising:
   a first section having a plurality of channels formed therein,
   a first flow distributor connected to the first section and disposed at a first end of the channels, the first flow distributor comprising distribution means for receiving coolant from an inlet and for supplying the coolant to the first end of the channels; and
   a second flow distributor connected to the first section and disposed at a second end of the channels, the second flow distributor comprising collection means for collecting the coolant from the channels and for expelling the coolant from the module,
   wherein the distribution means is of a converging shape with respect to the first end of the channels starting at the first end of a first one of the channels closest to the inlet and proceeding toward the first end of a second one of the channels furthest from the inlet, and wherein the collection means is of a diverging shape with respect to the channels starting at a the second end of the first one of the channels and proceeding toward the second end of the second one of the channels.

2. The electronic circuit cooling module of claim 1 wherein the first section comprises a plurality of I-shaped bars, the I-shaped bars being welded to one another so as to form the channels therebetween.

3. The electronic circuit cooling module of claim 1, further comprising, a top plate connected to the first section and disposed to cover the channels.

4. The electronic circuit cooling module of claim 1 wherein the first section comprises a plurality of bars, each of the bars having at least one protrusion on each side thereof.

5. The electronic circuit cooling module of claim 1 wherein the channels comprise at least one surface having a metallic alloy plating.

6. The electronic circuit cooling module of claim 1 wherein the channels comprise interweaved fins and wherein the channels have a width of less than 0.3 millimeters.

7. The electronic circuit cooling module of claim 1 wherein the channels comprise first and second pluralities of channels, the second plurality of channels is of a lesser number than the first plurality of channels.

8. The electronic circuit cooling module of claim 1 wherein the channels comprise flow turbulators disposed therein.

9. The electronic circuit cooling module of claim 8 wherein the flow turbulators are disposed alternately with one another on opposing walls of the channels.

10. The electronic circuit cooling module of claim 1, wherein the first section has a plurality of blind holes formed therein, the holes being disposed between the channels, and further comprising plurality of pistons disposed at least partially in the holes.

11. The electronic circuit cooling module of claim 10 wherein each of the pistons comprises a crown having a chip contacting surface, the chip contacting surface having a radius of curvature approximating that of a surface of an integrated circuit chip with which the chip contacting surface is to make contact.

12. The electronic circuit cooling module of claim 11 wherein the piston is of a barrel shape and comprises an upper tapered portion, a central cylindrical portion, and a lower tapered portion.

13. The electronic circuit cooling module of claim 12 wherein the upper portion is of greater length than the central portion.

14. An electronic circuit cooling module, comprising:
a first section having a plurality of serpentine channels formed therein,
a first flow distributor connected to the first section and disposed at a first end of the channels, the first flow distributor comprising distribution means for receiving coolant from an inlet and for supplying the coolant to the first end of each of the channels; and,
a second flow distributor connected to the first section and disposed at a second end of the channels, the second flow distributor comprising collection means for collecting the coolant from each of the channels and for expelling the coolant from the module,
wherein the distribution means converges with respect to the first end of the channels as a function of distance from the inlet and wherein the collection means converges with respect to the second end of the channels as a function of distance from the outlet.

* * * * *